United States Patent
Hönigschmid et al.

(10) Patent No.: US 6,294,294 B1
(45) Date of Patent: Sep. 25, 2001

(54) IMPLANTATION MASK FOR PRODUCING A MEMORY CELL CONFIGURATION

(75) Inventors: Heinz Hönigschmid, Starnberg; Georg Braun, München, both of (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/426,420

(22) Filed: Oct. 25, 1999

(30) Foreign Application Priority Data

Oct. 23, 1998 (DE) .............................................. 198 48 999

(51) Int. Cl.⁷ .................................. G03F 9/00; G03C 5/00
(52) U.S. Cl. .................................................. 430/5; 430/311
(58) Field of Search ................................ 430/5, 311, 394; 438/253, 254; 365/145

(56) References Cited

U.S. PATENT DOCUMENTS 5,121,353   6/1992   Natori ................................... 365/145
6,143,600 * 11/2000   Takaishi ............................... 438/253

OTHER PUBLICATIONS

"A Capacitor Over Bit–Line (COB) Stacked Capacitor Cell Using Local Interconnect Layer For 64 MbDRAMS" (Kasai et al.) in IEICE Trans Electron., vol. E76–C, No. 4, Apr. 1993, pp. 548–555.

* cited by examiner

Primary Examiner—S. Rosasco
(74) Attorney, Agent, or Firm—Herbert L. Lerner; Laurence A. Greenberg; Werner H. Stemer

(57) ABSTRACT

The memory cell configuration is formed with hybrid memory cells. Individual bit line pairs are isolated from one another by a respective bit line from an adjacent bit line pair, so that the memory cells are arranged relative to one another with ¼ division. This means that intrinsically cohesive implantation mask parts without connection or corner regions can be used, which avoids implantation problems and still permits production of transistors with a different threshold voltage.

4 Claims, 6 Drawing Sheets

IMPLANTATION MASK FOR PRODUCING A MEMORY CELL CONFIGURATION

BACKGROUND OF THE INVENTION

1. Field of the Invention

The present invention relates to the manufacture of a memory cell configuration comprising hybrid memory cells which are connected to word lines and bit lines in a matrix. Each of the memory cells comprises a storage capacitor and a selection transistor, each memory cell being allocated a short-circuit transistor with a threshold voltage which is different than the threshold voltage of the selection transistor. The invention is specifically directed to an implantation mask for producing such a memory cell configuration.

In conventional memory cell configurations, for example those having selection transistors and ferroelectric memory cells, generally only transistors of the same type are used in the memory cell array. Here, transistors "of the same type" means, in particular, that these transistors are of the same conductivity type and also each have the same threshold voltage. The use of such transistors of the same type brings with it the quite considerable advantage that the implantation necessary for setting the threshold voltage can be performed over a large area, and the production of the implantation mask is therefore completely noncritical.

By way of example, reference is had in this context to present-day DRAMs (dynamic write/read memories) which are composed of n-channel MOS transistors of the same type in the cell array. The cell array or cell field comprises word lines and bit line pairs comprising bit lines BL and bBL arranged next to one another.

Memory cell configurations of the above-mentioned type can experience problems caused by interference pulses, which ultimately lead to information losses. To prevent such information losses, it would appear possible to additionally allocate to each storage capacitor a short-circuit transistor which short-circuits the electrodes of the storage capacitor at particular times. However, the additional short-circuit transistor should preferably have a threshold voltage which is different than the threshold voltage of the selection transistor. In the above example of a DRAM having n-channel MOS field-effect transistors for the selection transistors, depletion-mode field-effect transistors can thus advantageously be used for the short-circuit transistors.

With reference to FIG. 4, there is shown a prior memory cell configuration having word lines WL0, WL1, WL2, WL3 and bit lines BL0, bBL0, BL1 and bBL1, selection transistors TG, ferroelectric storage capacitors Cferro and short-circuit transistors SG. In this configuration, the memory cells are connected to one another such that the line serving as a word line and as a control line has both selection transistors TG and short-circuit transistors SG connected to it. The selection transistors TG and the short-circuit transistors SG are connected to this line alternately.

The functional operation of such a memory cell configuration will be explained below, given the assumption that the selection transistors are enhancement-mode n-channel MOS field-effect transistors, and also that the short-circuit transistors are depletion-mode n-channel MOS field-effect transistors. Further, the threshold voltage of the short-circuit transistors, which is different from the threshold voltage of the selection transistors, is more negative than the negative value of the voltage on a common electrode PL.

When the memory cell configuration of FIG. 4 is first turned on, all the word lines WL are at 0 V. Then, the common electrode PL is firstly run up from 0 V to a voltage VDD/2 (VDD=supply voltage). Since the threshold voltage of the depletion-mode field-effect transistors is chosen to be correspondingly acutely negative, these field-effect transistors are then still turned on after the common electrode PL has been charged to VDD/2. This means that all the electrodes of the ferroelectric storage capacitors Cferro are short-circuited.

In order to be able to access particular memory cells, the appropriate word line, for example the word line WL2, is charged from 0 V to the full supply voltage VDD or above. As a result, the desired ferroelectric capacitors Cferro are connected to the appropriate bit lines BL. If these bit lines are at a potential which is higher or lower than the potential of the common electrode PL, charge compensation takes place between the selected ferroelectric capacitors Cferro and the associated bit lines BL. However, before this occurs, the short-circuit transistors SG which short-circuit the selected ferroelectric capacitors Cferro have to be turned off. This is done by a negative potential on the appropriate word line, for example on the word line WL3. This negative potential turns off only the desired depletion-mode field-effect transistors.

The enhancement-mode field-effect transistors, that is to say the selection transistors, which are also connected to the word line WL3, have already been turned off by the standby potential of 0 V and are merely given an even higher impedance by the negative potential.

After the read signal has been assessed and amplified, the selected word line, for example the word line WL2, is finally discharged to 0 V, which disconnects the selected memory cells from the bit lines. To produce the short circuit between the electrodes and the selected memory cells again, the word line connected to the corresponding depletion-mode field-effect transistor, that is to say the word line WL3 in the present example, is brought back to 0 V.

In the memory cell configuration shown in FIG. 4, as already indicated above, a bit line pair comprises two bit lines BL0 and bBL0 which are arranged next to one another and thus produce ½ division for a memory cell.

The manufacture of the memory cell configuration of FIG. 4 requires that the short-circuit transistors SG be provided with a different threshold voltage than the selection transistors TG. To this end, an additional implantation mask is necessary so that, for example, the properties of the short-circuit transistors—depletion-mode n-channel MOS field-effect transistors in the above example—can be set accordingly.

FIG. 5 shows a layout which is suitable for this. The layout has word lines WL0, WL1, WL2, . . . , active regions 10 below the bit lines (not shown), bit line contacts 11 and an implantation mask 12 which is designed such that, in the direction of the bit lines, two respective short-circuit transistors (below the implantation mask 12, for example) are followed by two selection transistors, as can also be seen in FIG. 4.

FIG. 6 shows the implantation mask 12 separately. The implantation mask 12 is to be understood such that the parts which are not stippled comprise a chromium layer 13. During implantation, mask problems occur in the corner or connection points of the chromium layer 13, as indicated by dashed circles 14.

These problems result from the fact that, when the mask is produced, no punctual resolution is possible, so that reinforced rounded corner features are produced which either do not implant (cf. arrow A) or cause undesirable implantation (cf. arrow B).

The above problems have thus made it impossible up to now in practice to produce a memory cell configuration having short-circuit transistors and selection transistors with a different threshold voltage satisfactorily.

SUMMARY OF THE INVENTION

It is accordingly an object of the invention to provide a memory cell configuration, which overcomes the above-mentioned disadvantages of the heretofore-known devices and methods of this general type wherein the selection transistors and short-circuit transistors can easily be provided with different threshold voltages. It is a further object to provide a corresponding implantation mask which is suitable for producing such a memory cell configuration.

With the foregoing and other objects in view there is provided, in accordance with the invention, an implantation mask for producing a memory cell configuration of the type having:

a plurality of hybrid memory cells arranged in a matrix and each including a storage capacitor and a selection transistor with a given threshold voltage;

a plurality of word lines and bit lines connecting the memory cells in the matrix;

each of the memory cell being connected to a short-circuit transistor having a threshold voltage different from the threshold voltage of the selection transistor; and the bit lines being arranged in a plurality of bit line pairs with the bit lines of each bit line pair being separated from one another by a respective bit line of an adjacent bit line pair, whereby the memory cells are arranged relative to one another with ¼ division;

the implantation mask comprising:

a mask body formed with a plurality of individual, cohesive implantation mask parts defined to be laid over mutually adjacent bit lines staggered in steps, extending across the memory cell matrix substantially parallel to one another, spaced from one another, and diagonally relative to the word lines and the bit lines.

In accordance with a concomitant feature of the invention, the mask is a chromium mask.

The memory cell field is organized such that the individual bit line pairs interleave one another, i.e. that the bit lines of each bit line pair are separated from one another by a respective bit line from another bit line pair. The memory cells are thus arranged relative to one another with ¼ division.

The implantation mask for producing such a memory cell configuration has individual implantation mask parts (implantation openings) that are aligned on adjacent bit lines so as to be staggered in steps to form intrinsically cohesive implantation mask parts. These staggered mask parts extend parallel to one another and at a distance from one another diagonally across the word lines and the bit lines.

The memory cell configuration according to the invention thus uses a different architecture than the previous prior art having ½ division: the individual bit line pairs are no longer arranged next to one another, but instead are each isolated by a bit line from another pair, which produces ¼ division. This makes it possible to carry out the implantation required for setting the threshold voltage using an implantation mask which can be designed as a continuous strip and has no corner or connection points. The novel implantation mask is formed with stepped, staggered implantation openings with a step height that corresponds approximately to the width of the individual implantation openings and with the individual openings aligned approximately at 45° to one another and to the bit lines and word lines. The "overlap" of the individual implantation openings, i.e., the open connection between the individual openings, is in the same order of magnitude as the openings themselves, In particular, the opening corresponds to the step height of the staggered configuration.

In the memory configuration according to the invention, the storage capacitors used can be ferroelectric storage capacitors, for example. However, the invention can advantageously also be used for other memories, for example flash memories, which require a hybrid structure.

Other features which are considered as characteristic for the invention are set forth in the appended claims.

Although the invention is illustrated and described herein as embodied in a memory cell configuration and implantation mask for producing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 3:
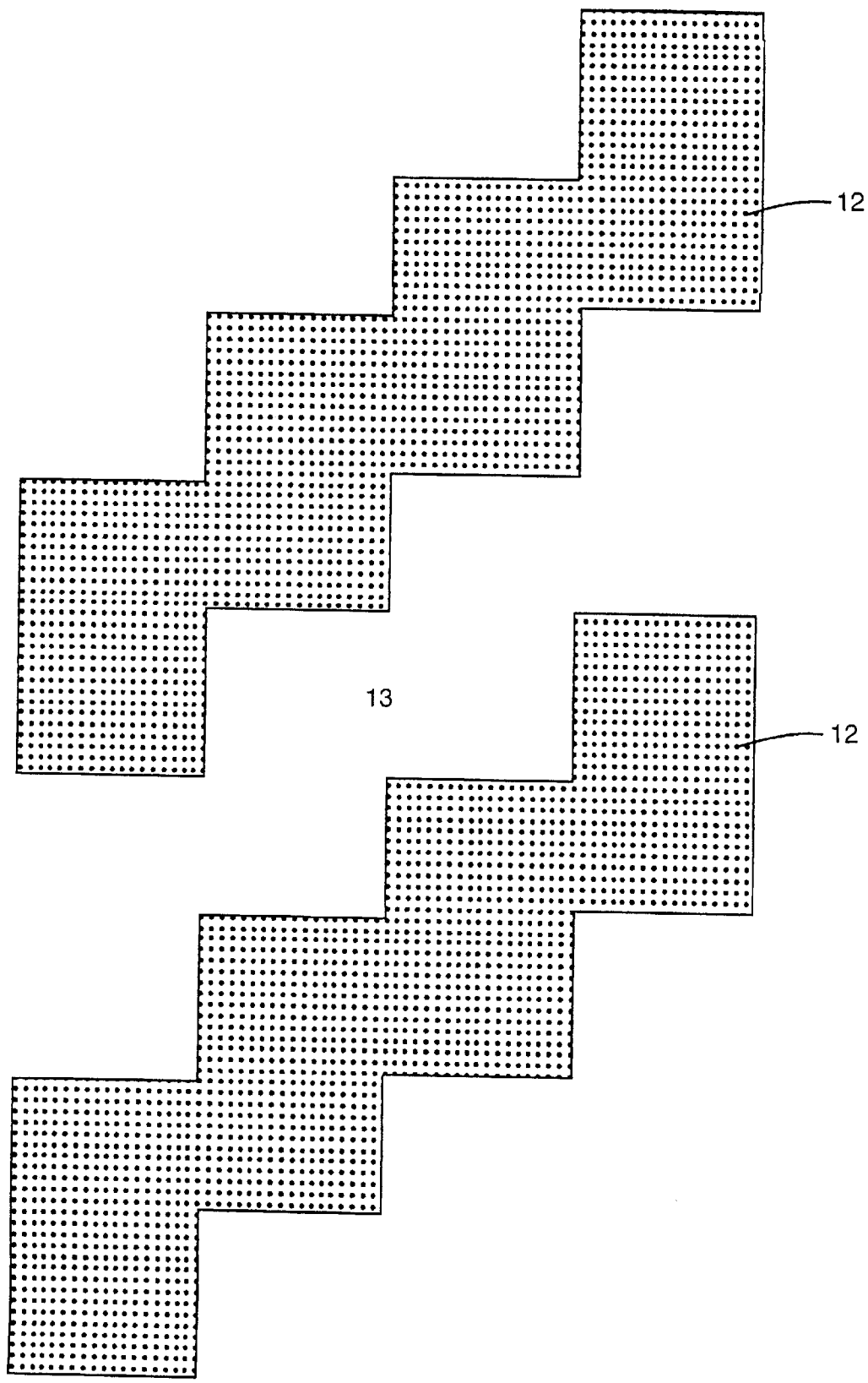
FIG. 3 is a diagrammatic view of the implantation mask used in the layout of FIG. 2.
Figure 4:
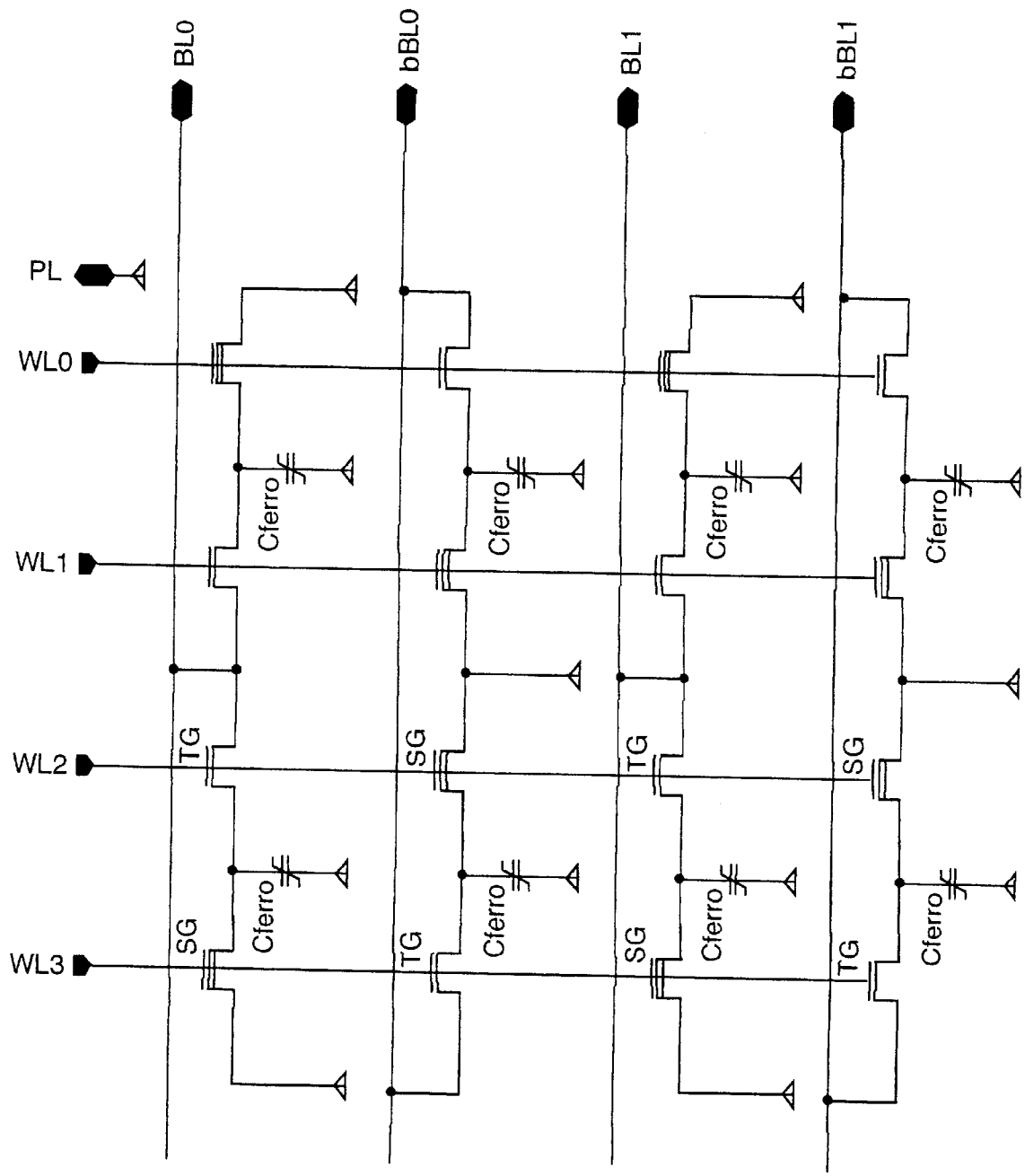
FIG. 4 is a diagrammatic view of a memory cell array of a conventional memory cell configuration.
Figure 5:
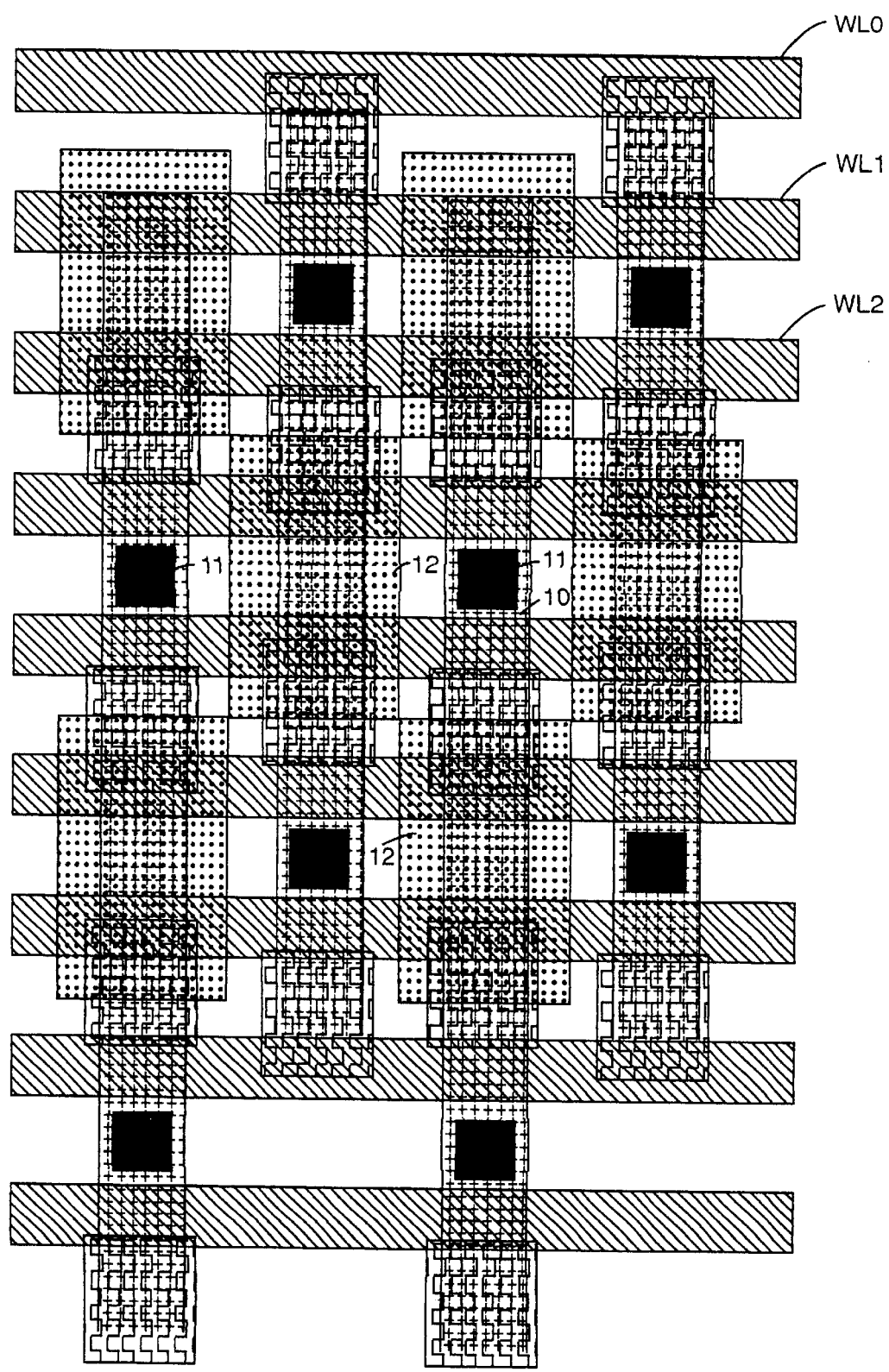
FIG. 5 is a diagrammatic view of a layout for producing the memory cell array of FIG. 4.
Figure 6:
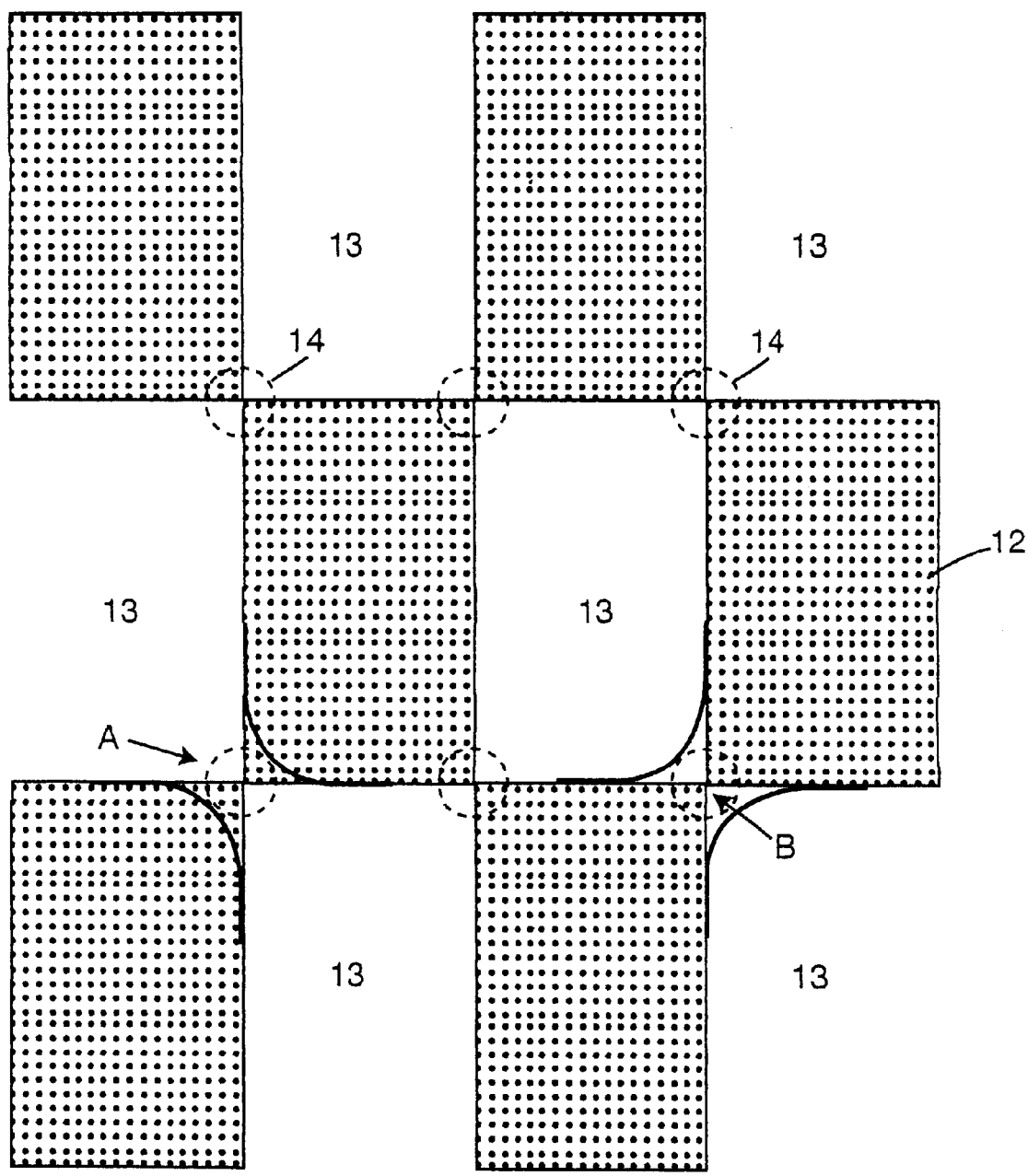
FIG. 6 is a diagrammatic view of the implantation mask for the layout of FIG. 5.

Reference is had to the above introductory description of FIGS. 4 to 6. Corresponding parts and components appearing in FIGS. 1 to 3 are provided with the same reference symbols as in FIGS. 4 to 6 and will not be explained separately.

Figure 1:
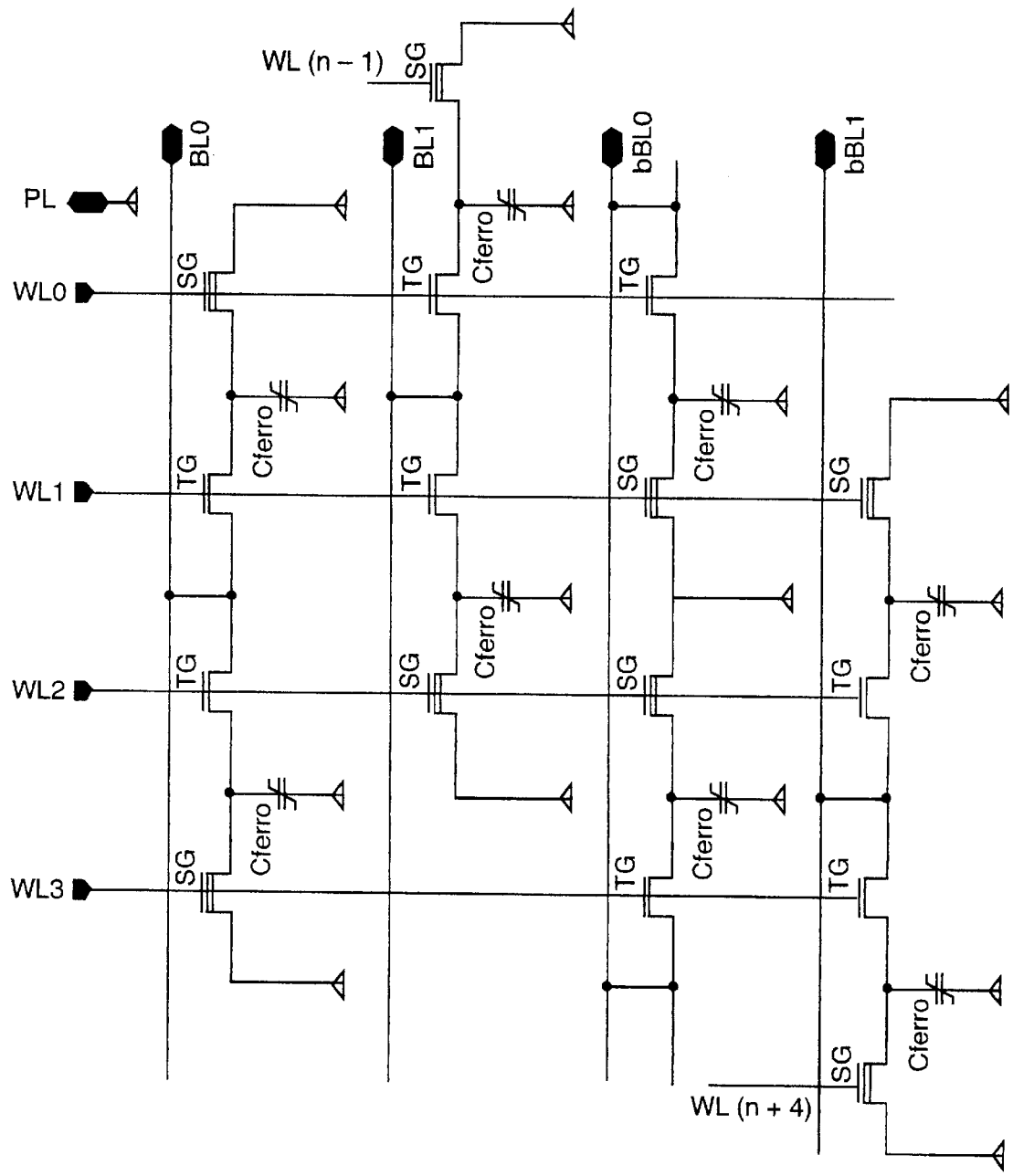
FIG. 1 is a diagrammatic view of a memory cell array of the memory cell configuration according to the invention.

FIG. 1 shows a memory cell array in which the bit lines BL0 and bBL0, and BL1 and bBL1, respectively, do not run next to one another in pairs. Instead, in this case, the bit line BL0 is followed by the bit line BL1, which is then followed by the bit lines bBL0 and bBL1. This means that the individual bit line pairs are isolated by a respective bit line from another bit line pair, which produces ¼ division for the memory cells relative to one another.

Figure 2:
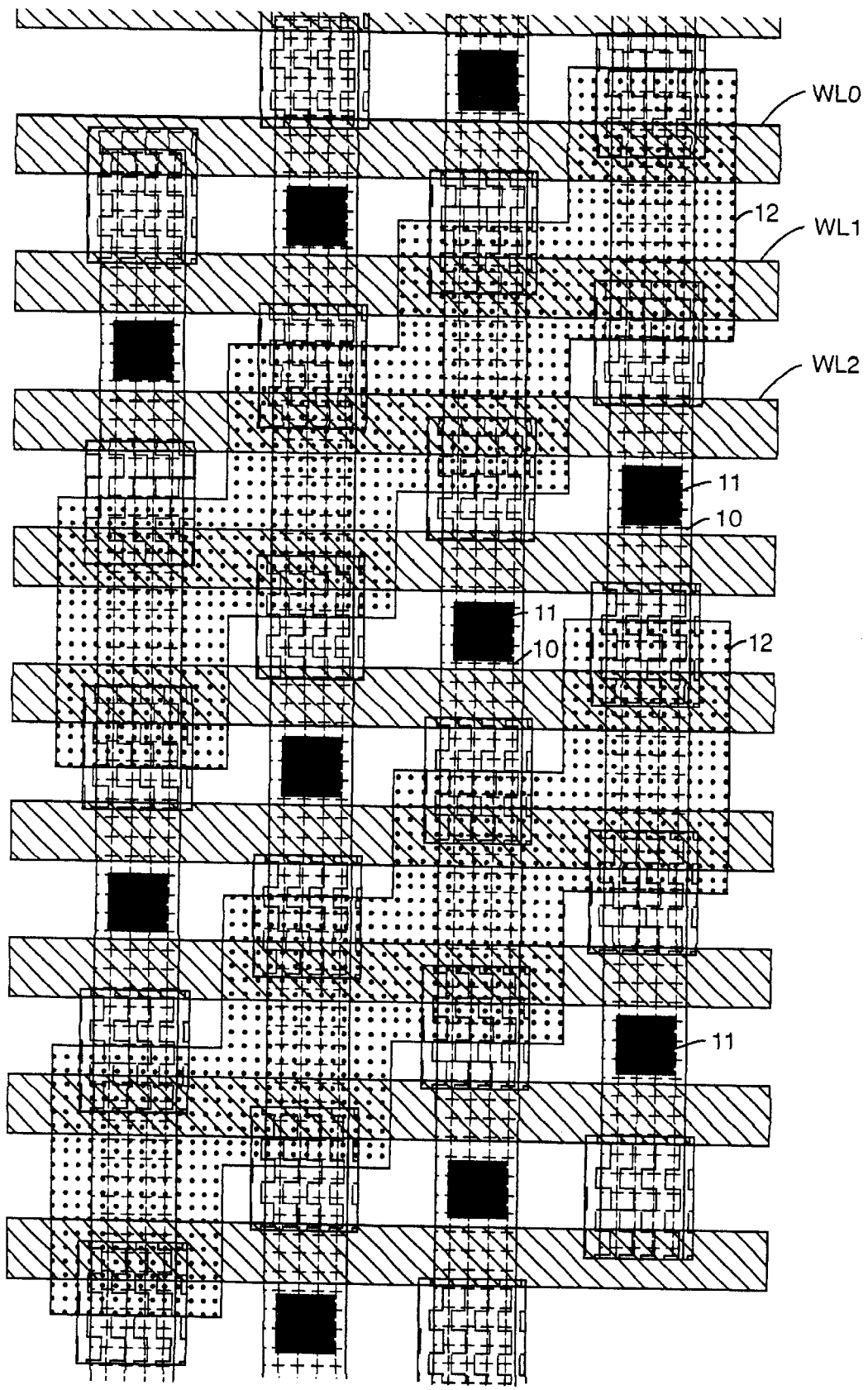
FIG. 2 is a diagrammatic view of a layout for producing the memory cell array of FIG. 1.

This different division has significant repercussions for the design of the implantation mask 12, as shown in FIG. 2: the implantation mask 12 comprises individual parts which are laid over adjacent bit lines so as to be staggered in steps such that each individual implantation mask part is intrinsically cohesive and the individual implantation mask parts run parallel to one another and at a distance from one another diagonally relative to the word lines and the bit lines. These implantation mask parts 12 and the chromium mask parts 13 which complement them are shown separately in FIG. 3. As can be seen clearly from FIGS. 2 and 3, no connection or corner regions of the implantation masks arise in the memory cell configuration according to the invention, so that problems linked to such regions can reliably be avoided. The novel design option for the implantation masks 12 is afforded by the ¼ division, which in turn is achieved by individual bit line pairs having a respective bit line from another pair laid between them.

We claim:

1. An implantation mask for producing a memory cell configuration of the type having:

a plurality of hybrid memory cells arranged in a matrix and each including a storage capacitor and a selection transistor with a given threshold voltage;

a plurality of word lines and bit lines connecting the memory cells in the matrix;

each of the memory cells being connected to a short-circuit transistor having a threshold voltage different from the threshold voltage of the selection transistor; and the bit lines being arranged in a plurality of bit line pairs with the bit lines of each bit line pair being separated from one another by a respective bit line of an adjacent bit line pair, whereby the memory cells are arranged relative to one another with ¼ division;

the implantation mask comprising:

a mask body formed with a plurality of individual, cohesive implantation mask parts defined to be laid over mutually adjacent bit lines staggered in steps, extending across the memory cell matrix substantially parallel to one another, spaced from one another, and diagonally relative to the word lines and the bit lines such that memory cells produced with the implantation mask are arranged relative to one another with ¼ division.

2. The implantation mask according to claim 1, wherein the mask body is formed of chromium.

3. An implantation mask for producing a memory cell configuration, comprising:

a mask body formed with a plurality of individual, cohesive implantation mask parts defined to be laid over mutually adjacent bit lines of a memory cell configuration staggered in steps, extending across a memory cell matrix of the memory cell configurations substantially parallel to one another, spaced from one another, and diagonally relative to word lines and the bit lines for producing a memory cell in which the bit lines are arranged in a plurality of bit line pairs with the bit lines of each bit line pair separated from one another by a respective bit line of an adjacent bit line pair, such that the memory cells are arranged relative to one another with ¼ division.

4. The implantation mask according to claim 3, wherein the mask body is formed of chromium.

* * * * *